United States Patent
Durkee (10) Patent No.: US 11,059,574 B2
(45) Date of Patent: Jul. 13, 2021

(54) ELECTRONIC BRAKING ARRANGEMENTS

(71) Applicant: Simmonds Precision Products, Inc., Vergennes, VT (US)

(72) Inventor: Scott R. Durkee, New Haven, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 16/931,998

(22) Filed: Jul. 17, 2020

(65) Prior Publication Data
US 2020/0346741 A1 Nov. 5, 2020

Related U.S. Application Data

(63) Continuation of application No. 15/610,028, filed on May 31, 2017.

(51) Int. Cl.
| | |
|---|---|
| *B64C 25/44* | (2006.01) |
| *B60T 13/74* | (2006.01) |
| *B60T 8/17* | (2006.01) |
| *H02P 27/06* | (2006.01) |
| *F16D 55/36* | (2006.01) |
| *H03K 17/567* | (2006.01) |
| *F16D 121/18* | (2012.01) |

(52) U.S. Cl.
CPC .......... *B64C 25/44* (2013.01); *B60T 8/1703* (2013.01); *B60T 13/741* (2013.01); *F16D 55/36* (2013.01); *H02P 27/06* (2013.01); *H03K 17/567* (2013.01); *F16D 2121/18* (2013.01)

(58) Field of Classification Search
CPC ..... F16D 55/36; F16D 2121/18; B64C 25/44; H03K 17/567
See application file for complete search history.

(56) References Cited

U.S. PATENT DOCUMENTS

| | | | |
|---|---|---|---|
| 7,349,787 B2 | 3/2008 | Thibault | |
| 7,523,812 B2 | 4/2009 | Thibault et al. | |
| 9,385,637 B2 | 7/2016 | Dolti | |
| 2005/0109568 A1 | 5/2005 | Ether | |
| 2007/0235267 A1* | 10/2007 | Liebert | ................... F16D 65/38 188/1.11 L |
| 2009/0281702 A1 | 11/2009 | Cahill | |

(Continued)

FOREIGN PATENT DOCUMENTS

| | | |
|---|---|---|
| CN | 102361391 A | 2/2012 |
| EP | 1686029 A1 | 8/2006 |

(Continued)

OTHER PUBLICATIONS

Extended European Search Report dated Oct. 26, 2018, issued during the prosecution of European Patent Application No. EP 18175045.6 (11 pages).

*Primary Examiner* — Melanie Torres Williams
(74) *Attorney, Agent, or Firm* — Locke Lord LLP; Joshua L. Jones; Scott D. Wofsy (57) ABSTRACT

An electronic braking arrangement includes a brake stack assembly, a driver circuit, a current limiter circuit, and a voltage limiter circuit. The driver circuit is operably connected to the brake stack assembly. The current limiter circuit and the voltage limiter circuit are connected in series between the driver circuit and the brake stack assembly to drive friction brake loads in the brake stack assembly with a voltage limited constant drive current.

16 Claims, 5 Drawing Sheets

(56) References Cited

U.S. PATENT DOCUMENTS

2014/0265954 A1    9/2014   Kobayashi
2017/0001610 A1*   1/2017   Singh ........................ B60T 8/17

FOREIGN PATENT DOCUMENTS

| EP | 3139495 A2 | 3/2017 |
| JP | 2007215365 A | 8/2007 |
| WO | 2007071033 A1 | 6/2007 |

* cited by examiner

ELECTRONIC BRAKING ARRANGEMENTS

CROSS-REFERENCE TO RELATED APPLICATIONS

This application is a continuation of U.S. patent application Ser. No. 15/610,028, filed May 31, 2017, the entirety of which is incorporated by reference herein.

BACKGROUND OF THE INVENTION

1. Field of the Invention

The present disclosure relates to braking, and more particularly to electronic braking arrangements such as in aircraft landing gear systems.

2. Description of Related Art

Vehicles, such as aircraft, commonly have electrically actuated braking systems. The braking system typically includes an actuation circuit operable to move a friction pad into contact with a rotor. The rotor is generally fixed relative to a wheel and rotatable relative to the friction pad such that, upon actuation, the friction pad comes into contact with the rotor to resist rotation of the rotor and the wheel. The brake stack typically includes a solenoid or coil that is arranged to receive an actuation current from a current source. The actuation current generates an electromagnetic force that drives the friction pad into frictional engagement with the rotor, the friction pad thereby opposing rotation of the rotor and wheel assembly.

In some braking systems the rotor includes a set of locking friction pads arranged as a brake stack. Two or more solenoids or coils are operable to cooperatively move the friction pads into frictional engagement with the rotor, typically by receiving proportions of a driver current applied to the brake stack by the driver circuit. The solenoids or coils are typically connected to the actuation current source in parallel with one another such that the portion of the actuation current corresponds to the resistance of the respective solenoid or coil.

Such conventional methods and systems have generally been considered satisfactory for their intended purpose. However, there is still a need in the art for improved driver circuits, braking systems, and methods of engaging and disengaging brakes in aircraft landing gear systems. The present disclosure provides a solution to this need.

SUMMARY OF THE INVENTION

An electronic braking arrangement includes a brake stack assembly, a driver circuit, a current limiter circuit, and a voltage limiter circuit. The driver circuit is operably connected to the brake stack assembly. The current limiter circuit and the voltage limiter circuit are connected in series between the driver circuit and the brake stack assembly to drive friction brake loads in the brake stack assembly with a voltage limited constant drive current.

In certain embodiments, electronic braking arrangement can be a parking brake arrangement. The brake stack assembly can include two or more electrical loads connected electrically in parallel with each other. The two or more electrical loads can include coils or windings. The coil or windings of each electrical load can be operably connected to individual friction pads of the brake assembly. The brake stack assembly can include four electrical loads operably connected to four friction pads in a landing gear rotor/wheel arrangement.

In accordance with certain embodiments, the driver circuit can be arranged to issue a slowly ramping voltage pulse. The slowly ramping voltage pulse can be issued to the stack assembly through the driver circuit and current limiter circuit to actuate the brake stack assembly. The driver circuit can include a source lead, a return lead, and a control lead. The source lead can be connected by the driver circuit to the current limiter circuit. The return lead can connect the voltage limiter circuit to a ground terminal through the driver circuit. The driver circuit can include a solid-state switch connected in series between the source lead and the current limiter circuit. The control lead can be operably connected to the solid-state switch.

It is contemplated that the current limiter circuit can include a first resistor leg and a second resistor leg. The first resistor leg can have a solid-state switch. The switch can be an insulated gate bipolar transistor (IGBT) with a collector and an emitter. A reference voltage source can be connected between the brake assembly and the IGBT emitter. First and second resistors can be connected in series with one another and between the IGBT collector and the current limiter circuit. The first resistor can have a resistance that is greater than the resistance of the second resistor.

It is also contemplated that, in accordance with certain embodiments, the second resistor leg can include a switch device. The second resistor leg switch device can be a MOSFET with source, a drain, and a gate. A resistor can be connected in series with the MOSFET source and between the MOSFET and the current limiter circuit. A diode can be connected in series with the MOSFET drain and between the brake stack assembly and the MOSFET. The diode can be arranged to oppose current flow from the brake stack assembly to the MOSFET. The IGBT can be a first IGBT and the current limiter circuit can include a second IGBT. An emitter of the second IGBT can be connected to the second resistor leg. A collector of the second IGBT can be connected to the first resistor leg.

In further embodiments the voltage limiter circuit can include a MOSFET. The MOSFET can be connected in series between the brake stack assembly and the current limiter circuit. A gate of the MOSFET can be connected to the return lead. A drain of the MOSFET can be connected to the current limiter circuit. A gate of the MOSFET can be connected to the return lead. First and second Zener diodes can be connected in series with one another and in parallel with a capacitor between the source lead and the return lead.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
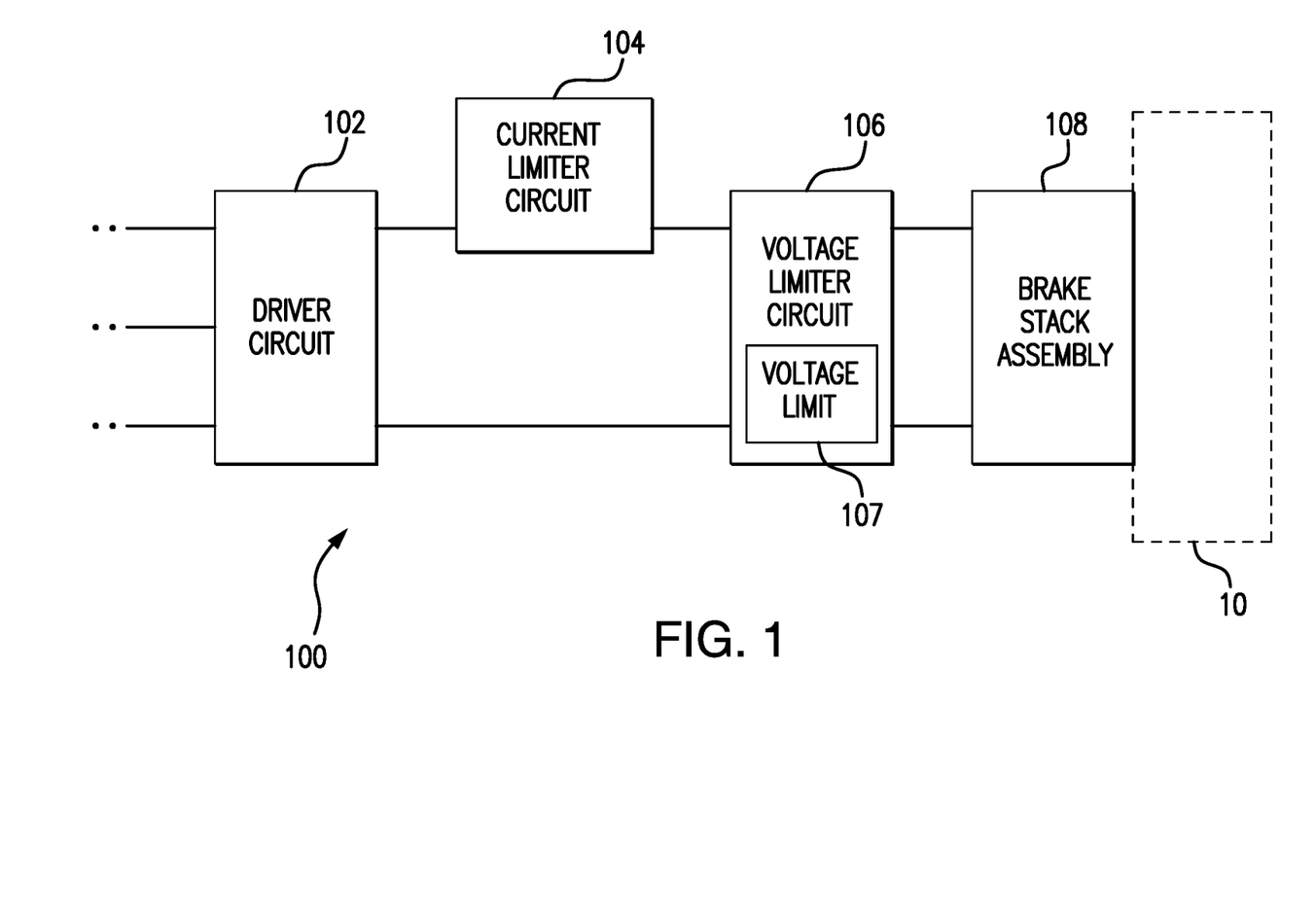
FIG. 1 is a block diagram of an exemplary embodiment of an electronic braking arrangement for an aircraft landing gear system constructed in accordance with the present disclosure, showing driver circuit connected to a brake stack assembly through a current limiter circuit and a voltage limiter circuit.

Reference will now be made to the drawings wherein like reference numerals identify similar structural features or aspects of the subject disclosure. For purposes of explanation and illustration, and not limitation, a partial view of an exemplary embodiment of an electronic braking arrangement in accordance with the disclosure is shown in FIG. 1 and is designated generally by reference character 100. Other embodiments of electronic braking arrangements and methods of actuating electronic braking arrangements in accordance with the disclosure, or aspects thereof, are provided in FIGS. 2-5, as will be described. The systems and methods described herein can be used to implement parking brake functionality in aircraft landing gear, though the present disclosure is not limited to parking brake functionality to aircraft landing gear systems in general.

Referring to FIG. 1, electronic braking arrangement 100, e.g., a parking brake arrangement for an aircraft landing gear system, is shown. Electronic braking arrangement 100 includes a driver circuit 102, a current limiter circuit 104, a voltage limiter circuit 106 with a voltage limit 107, and a brake stack assembly 108. Driver circuit 102 is operably connected to brake stack assembly 108. Current limiter circuit 104 and voltage limiter circuit 106 are connected electrically in series with one another between driver circuit 102 and brake stack assembly 108 to actuate brake friction pads, e.g., a friction pad 124 (shown in FIG. 2), in a rotor/wheel assembly 10 with a voltage-limited constant drive current, e.g., drive current 14 (shown in FIG. 2). Voltage limit 107 is selected such that drive current 14 applied to brake stack assembly 108 can rise to a predetermined value in response to resistance increase, and thereafter remains constant as resistance further increases.

Figure 2:
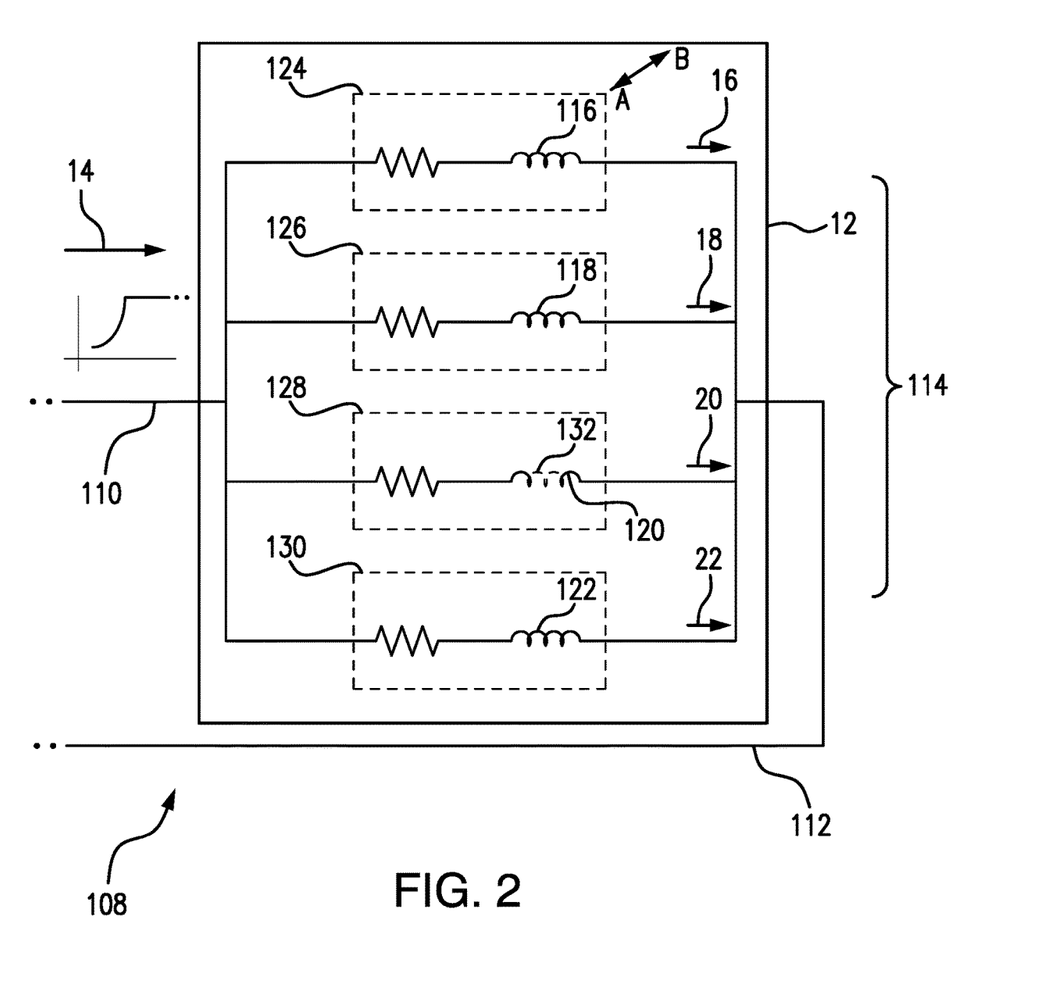
FIG. 2 is a circuit schematic of the brake stack assembly of FIG. 1, showing parallel electrical loads operably connected to friction pads of a rotor/wheel assembly.

With reference to FIG. 2, brake stack assembly 108 is shown. Brake stack assembly 108 includes a source lead 110, a return lead 112, and a brake stack 114. Brake stack 114 includes a plurality of electrical loads 116-122 that are operatively coupled to friction pads 124-130. Friction pads 124-130 are each movable between a disengaged position A, wherein friction pads 124-130 are spaced apart from a rotor 12 of rotor/wheel assembly 10 (shown in FIG. 1), and an engaged position B, wherein friction pads 124-130 being in frictional contact with rotor 12 in the engaged position. Movement of the respective friction pads 124-130 occurs when current flow through electrical loads 116-122, e.g., a coils or windings connected in series with a respective resistor, exceeds a selected value.

In the illustrated exemplary embodiment brake stack 114 includes a first electrical load 116 with an inductor connected in series with a resistor, a second electrical load 118 with an inductor connected in series with a resistor, a third electrical load 120 with an inductor connected in series with a resistor, and a fourth electrical load 122 with an inductor connected in series with a resistor. First electrical load 116 is connected between source lead 110 and return lead 112 and is operably connected to a first friction pad 124. Second electrical load 118 is connected between source lead 110 and return lead 112, is connected electrically in parallel with first electrical load 116, and is operably connected to a second friction pad 126. Third electrical load 120 is connected between source lead 110 and return lead 112, is connected electrically in parallel with second electrical load 118, and is operably connected to a third friction pad 128. Fourth electrical load 122 is connected between source lead 110 and return lead 112, is connected electrically in parallel with third electrical load 120, and is operably connected to a fourth friction pad 130. Although electronic braking arrangement 100 is described herein as having four electrical loads comprising coils or windings, it is to be understood and appreciated electronic braking arrangement 100 can have fewer than or more than four electrical loads, including non-coil or winding electrical loads, as suitable for an intended application.

During actuation driver circuit 102 (shown in FIG. 1) applies drive current 14 to brake stack 114 through source lead 110. Drive current 14 flows through each of the parallel windings or coils in a proportion that corresponds to the relative resistance of each of the coils or windings of electrical loads 116-122. In embodiments where the electrical resistance of each electrical load, e.g., electrical loads 116-122, are substantially equivalent to one another, current flows 16-22 through each of the electrical loads is substantially equivalent to that through the other electrical loads. For example, in the illustrated exemplary embodiment, current flow 16 is about one quarter of drive current 14, current flow 18 is about one quarter of drive current 14, current flow 20 is about one quarter of drive current 14, and current flow 22 is about one quarter of source current flow 14. As will be appreciated by those of skill in the art in view of the present disclosure, equivalent proportioning of drive current 14 among electrical loads 116-122 provides synchronous movement of friction pads 124-130 between the engaged position A and disengaged position B relative to rotor 12.

As will be also appreciated by those of skill in the art in view of the present disclosure, resistance increase in a given electrical load can increase the proportion of current flowing through the other electrical loads. For example, if third electrical load 120 develops an open 132 (indicated with an exemplary with dotted segment of third electrical load 120), magnitudes of current flows 16, 18 and 22 can increase to about one-third of drive current flow 14. The increased magnitudes of current flows 16, 18 and 22 in turn exerts additional current stress on the remaining connected electrical loads (i.e. first electrical load 116, second electrical load 118 and fourth electrical load 122), generating additional heat and potentially damaging one or more of the remaining connected electrical loads. For that reason, some electronic braking arrangements employ electrical loads sized to accommodate current flows well above that normally received to actuate a given friction pad. While generally satisfactory for its intended purpose, oversizing electrical loads in brake stack assemblies can add weight and cost to the brake stack assembly. To reduce (or eliminate entirely) the need to oversize electrical loads 116-122 in brake stack 114 in the event that one or more of electrical loads 116-122 increases in resistance or fails open, electronic brake arrangement 100 (shown in FIG. 1) includes current limiter circuit 104 (shown in FIG. 1) and voltage limiter circuit 106 (shown in FIG. 1).

Current limiter circuit 104 and voltage limiter circuit 106 cooperate to adjust the current applied to brake stack 114 when resistance of one or more electrical loads therein increases by correspondingly reducing the magnitude of drive current 14. In this respect voltage limit 107 (shown in FIG. 1) is selected to allow drive current 14 to rise to current limit (shown in dotted outline) in response to current supplied to the remaining electrical loads by reducing magnitude of drive current 14 once current rises above a selected current value. For example, in certain embodiments, voltage limiter circuit 106 has a voltage limit 107 (shown in FIG. 1). Voltage limit 107 that allows for increase in the magnitude of drive current 14 applied to electrical loads 116-122 such that current flow through any one of the electrical loads 116-122 can rise no more than about 30%. Once voltage rises to voltage limit 107 current limiter circuit 104 decreases the magnitude of drive current 14 thereafter applied to electrical loads 116-122 commensurate with further resistance increase in electrical loads 116-122. The subsequent decrease in drive current 14 causes the magnitude of current flows 16-22 to remain within the current rating of electrical loads 116-122 notwithstanding subsequent resistance increase in electrical loads 116-122, for example, by a second one of electrical loads 116-122 becoming electrically open.

In an exemplary embodiment of landing gear arrangement 100 (shown in FIG. 1) electrical loads 116-122 are each rated for about 0.6 amps. Voltage limit 107 is selected such that electrical loads 116-122 each receive about 0.3 amps when resistance is equivalent among each of electrical loads 116-122, each electrical load 116-122 receive no more than 0.4 amps when one or more than electrical loads 116-122 become electrically open, and each electrical load 116-122 receive no more than 0.4 amps when two or more of electrical loads 116-122 become electrically open. This limits (or eliminates) the stress that otherwise is exerted on the remaining electrical loads when one or more of the electrical loads experiences a resistance increase (or becomes open) by allowing continued operation of the remaining electrical loads within the their respective current rating. Current limiter circuit 104 and voltage limiter circuit 106 are also arrangement to cooperate with slowly ramping drive current 14, which reduces (or eliminates entirely) the need to harden electrical devices in proximity to electronic brake arrangement 100 to upset/crosstalk issues that can otherwise arise when pulse width modulated (PWM) drive current are employed to actuate brake stack 114. As used herein, slowly ramping refers to drive currents that rise to a selected threshold to actuate brake stack 114 is a time interval greater than that required by PWM signals, e.g., 10 kilohertz PWM drive current signals.

Figure 3:
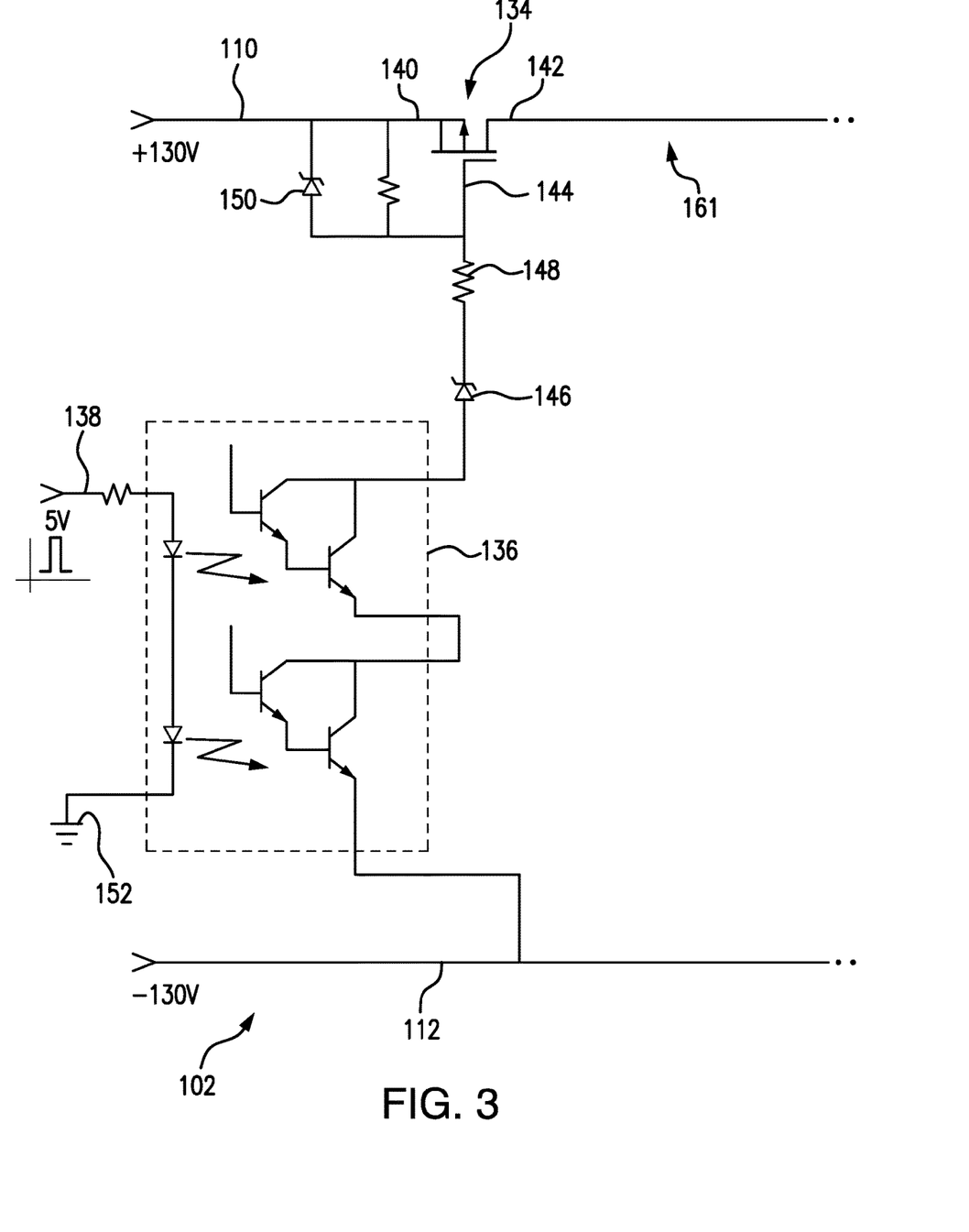
FIG. 3 is a circuit schematic of the driver circuit of FIG. 1, showing a solid-state switch connected to the source lead and operably connected to a control lead for applying a slowing ramping actuation current to the brake stack assembly.

With reference to FIG. 3, driver circuit 102 is shown. Driver circuit 102 includes a switch device 134, a transistor module 136, a control lead 138, source lead 110 and return lead 112. In the illustrated exemplary embodiment switch device 134 is a MOSFET device with a source 140, a drain 142 and a gate 144. Transistor module 136 is connected to drain 142 through a Zener diode 146, which is arranged to oppose current flow from gate 144 through a serially connected resistor 148. Drain 142 is connected to current limiter circuit 104 (shown in FIG. 1) via a source lead input segment 161. Source 140 is connected to source lead 110, and further to transistor module 136 through a serially connected Zener diode 150. Zener diode 150 is arranged to oppose current flow from source lead 110 to transistor module 136. In certain embodiments, Zener diode can be a P4SMA100A TVS diode, available from Vishay Intertechnology of Malvern, Pa.

It is contemplated that switch device 134 be a power MOSFET arranged within driver circuit 102 to operate as a linear regulator, the power MOSFET thereby operating within the power MOSFET linear region. Operating as linear regulator, switch device 134 can potentially experience high thermal stress due to the simultaneous occurrence of high drain voltage and current, resulting in high power dissipation. To alleviate (or prevent entirely) high thermal stress, the power MOSFET incorporated in switch device 134 has high power dissipation capability and an extended forward-bias safe operating area, the latter being achieved by the power MOSFET suppressing positive feedback associated with electro thermal instability. Examples of suitable power MOSFET devices for switch device 134 include IXTR32P60P MOSFET devices, available from IXYS Corporation of Milpitas, Calif.

Transistor module 136 is connected to control lead 138, return lead 112 and a ground terminal 152. Examples of suitable transistor modules include CPC1302 transistor modules, available from IXYS Integrated Circuits Division of Beverley Mass. In certain embodiments control lead 138, source lead 110, and return lead 112 are connected to DC power sources, control lead 138 receiving logic signals therethrough to actuate brake stack assembly 108 (shown in FIG. 1), source lead 110 and return lead 112 being connected to a DC power source for selective application of power therefrom to brake stack assembly 108. In an exemplary embodiment control lead 138 is connected to a 5 volt DC power source for receiving a logical on/off control signal, and source lead 110 and return lead 112 are respectively connected to positive and negative terminals of a 130 volt DC power source for energizing electrical loads 116-122 (shown in FIG. 2) of brake stack assembly 108.

Figure 4:
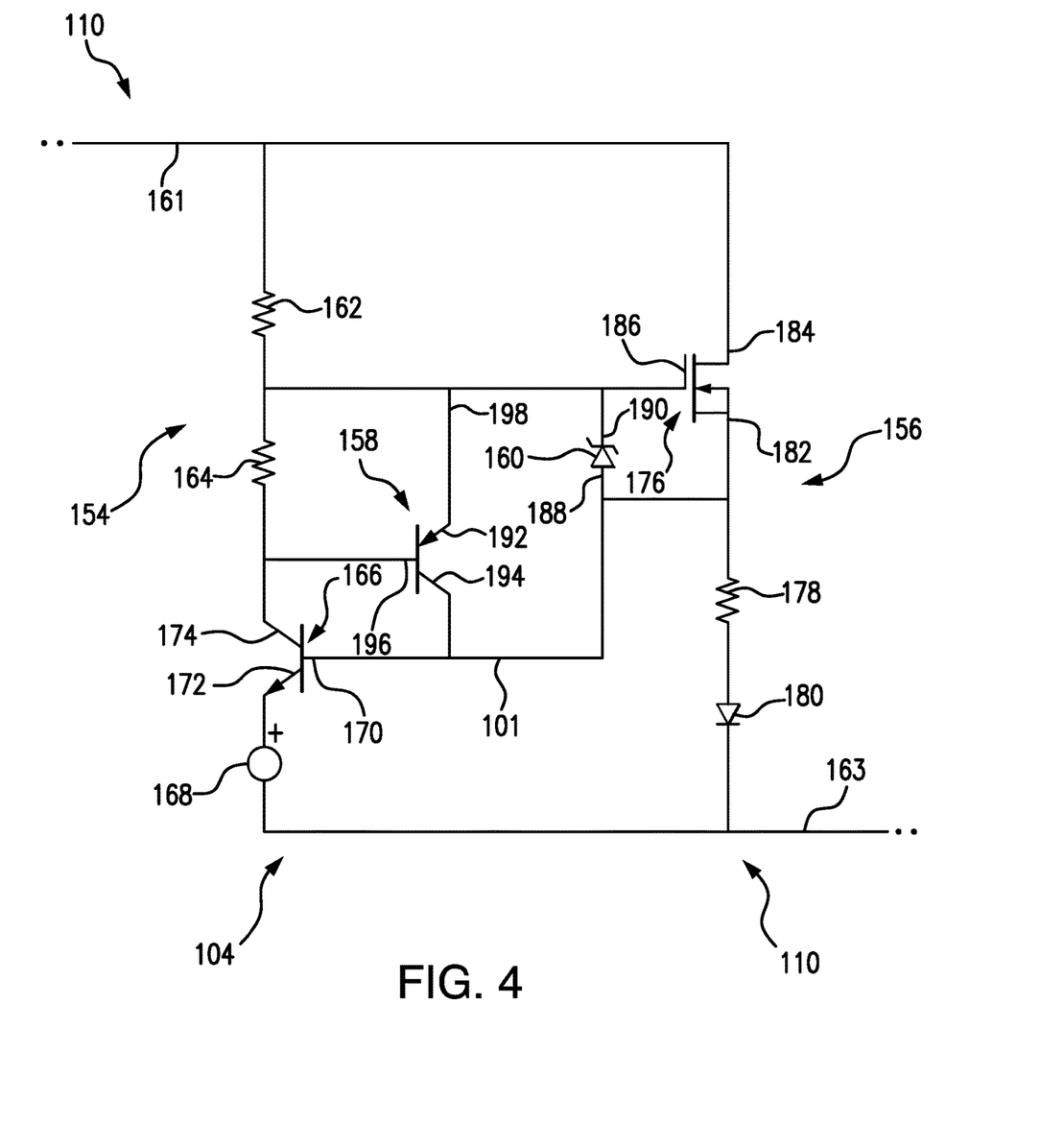
FIG. 4 is a circuit schematic of the voltage limiter circuit of FIG. 1, showing parallel resistor legs with solid-state switches connected between the current limiter circuit and the brake stack assembly for limiting voltage applied to the brake stack assembly.

With reference to FIG. 4, current limiter circuit 104 is shown. Current limiter circuit 104 is connected in series with source lead 110, and therethrough to driver circuit 102 (shown in FIG. 1), and includes a first resistor leg 154, a second resistor leg 156, a switch device 158, and a diode 160. First resistor leg 154 and second resistor leg 156 are connected in parallel with one another between a source lead input segment 161 and a source lead output segment 163. Switch device 158 and diode 160 are connected to both first resistor leg 154 and second resistor leg 156.

First resistor leg 154 includes a first resistor 162, a second resistor 164, a switch device 166, and a reference voltage source 168. First resistor 162 is connected to source lead input segment 161 and second resistor leg 156. Second resistor 164 is connected in series with first resistor 162 and has a resistance that is smaller than a resistance of first resistor 162, e.g., having a resistance that is about 5% the resistance of first resistor 162. Switch device 166 is connected in series with second resistor 164 and includes an IGBT device with a gate 170, an emitter 172, and a collector 174. Reference voltage source 168 is connected in series with emitter 172 and source lead output segment 163 and has an output voltage. In certain embodiment the output voltage is 1.0 volts. Examples of suitable reference voltage sources include ADR510 voltage sources, available from Analog Devices Inc. of Norwood, Mass. In accordance with certain embodiments switch device 166 can be a 2N2222 IGBT device, available from ST Microelectronics of Geneva, Switzerland.

Second resistor leg 156 includes a switch device 176, a resistor 178, and a diode 180. Switch device 176 includes a MOSFET device with a source 182, a drain 184, and a gate 186, source 182 connecting to source lead output segment 163 and first resistor leg 154. Resistor 178 is connected in series with drain 182 and diode 180. Diode 180 is connected in series between resistor 178 and source lead output segment 163 and is arranged to oppose current flow from source lead output segment 163 to resistor 178. It is contemplated that diode 180 can be an SMLJ60S6 diode, available from Micro Commercial Components, Inc. of Thief River Falls, Minn. The MOSFET included in switch device 176 can be a power MOSFET device arranged to operate as linear regulator and configured for high power dissipation capability and extended forward-bias safe operating area. Examples of suitable power MOSFET devices include IXTB30N100L Linear Power MOSFET devices, also available from IXYS Corporation of Milpitas, Calif.

Zener diode 160 has an anode 188 and a cathode 190. Anode 188 is connected to switch device gate 170 and second resistor leg 156, connection to second resistor leg 156 being at a location interposed between source 182 and resistor 178. Cathode 190 is connected to switch device gate 186 and first resistor leg 154, connection to first resistor leg 154 being at a location between first resistor 162 and second resistor 164. Zener diode 1160 can be a P4SMA24A TVS diode, available from Vishay Intertechnology of Malvern, Pa.

Switch device 158 is an IGBT device with a collector 192, an emitter 194 and a gate 196. Collector 192 is connected to a lead 198 interconnecting first resistor leg 154, switch device gate 186, and Zener diode cathode 190. Gate 196 is connected to first resistor leg 154 at a location between second resistor 164 and collector 174. Emitter 194 is connected to a lead 101, which interconnects emitter 194 with gate 170 of switch device 166, Zener diode anode 188, and second resistor leg 156 at a location between switch device 176 and resistor 178. Switch device 158 can include a 2N2907 IGBT device, available from ST Microelectronics of Geneva, Switzerland.

Figure 5:
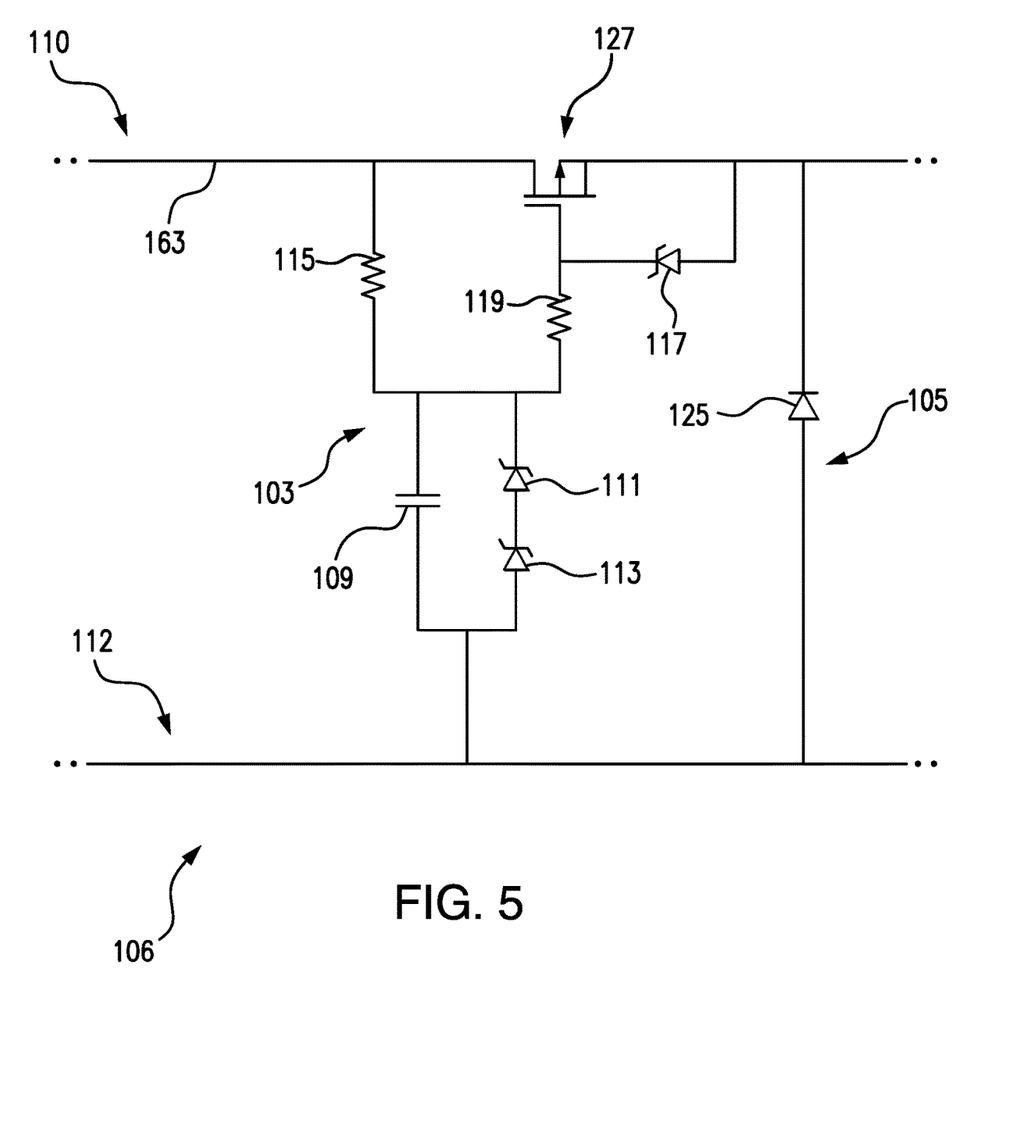
FIG. 5 is a circuit schematic of the current limiter circuit of FIG. 1, showing a switch and Zener diodes connected in parallel with a capacitor between the source and return leads for maintaining constant current flow through the brake stack assembly electrical loads irrespective of resistance change in one or more of the electrical loads.

With reference to FIG. 5, voltage limiter circuit 106 is shown. Voltage limiter circuit 106 interconnects source lead 110 with return lead 112 and includes a first branch 103, a second branch 105 with a freewheeling or flyback diode 125, and a switch device 127. Freewheeling or flyback diode 125 is arranged to oppose current flow from source lead 110 to return lead 112. Switch device 127 includes a MOSFET device arranged as a linear regulator and is connected in series with source lead 110 between current limiter circuit 104 (shown in FIG. 1) and brake stack assembly 108 (shown in FIG. 1). Switch device 127 can include an IXTX22N100L Linear Power MOSFET device, also available from IXYS Corporation of Milpitas, Calif.

First branch 103 includes a capacitor 109, first Zener diode 111, and a second Zener diode 113. Second Zener diode 113 is connected in series with first Zener diode 111, serially connected first Zener diode 111 and second Zener diode 113 both being arranged to oppose current from source lead 110 to return lead 112. Capacitor 109 is connected in parallel with serially connected first Zener diode 111 and second Zener diode 113, positive and negative charge plates of capacitor 109 being connected to source lead 110 and return lead 112, respectively. The negative charge plate of capacitor 109 connects directly to return lead 112 and the anode of second Zener diode 113.

The positive charge plate of capacitor 109 connects to source lead 110 through a resistor 115, and is further connected to the cathode of first Zener diode 111, a gate of switch device 127 via an intervening resistor 119, and to a source of switch device 127 via resistor 115 and a Zener diode 117. Zener diode 117 is arranged to oppose current flow from resistor 115 to source lead 110. First Zener diode 111 can be a P4SMA56A diode, available from Vishay Intertechnology of Malvern, Pa. Second Zener diode 113 can be a P4SMA24A TVS diode, also available from Vishay Intertechnology of Malvern, Pa.

Friction brake driver electronics commonly employ friction brake driver electronics with pulse width modulated drive currents to actuate the associated friction brake. Examples of such driver electronics include the EBAC-5 friction brake driver electronics unit, available from Simmonds Precision Products, Inc. of Vergennes, Vt. While satisfactory for its intended purpose, the 10 kilohertz 50% PWM drive achieved by square wave modulation of the DC link voltage employed by such systems can impose electrical shielding requirements on electrical devices in proximity to the driver electronics due to associated radio-frequency emissions.

In certain embodiments described herein, electronic braking arrangement 100 includes a non-PWM driver circuit 102. Driver circuit 102 is arranged to apply a constant drive current, e.g., drive current 14 (shown in FIG. 3), that is voltage limited by a voltage limit 107 (shown in FIG. 1) to drive a parallel combination of friction brake pads located in a brake stack assembly 108 (shown in FIG. 2). It is contemplated that drive current 14 ramp slowly (relative to the rate of change in a PWM drive signal), thereby reducing (or eliminating) emissions that could otherwise impose a requirement for shielding due to upset/crosstalk between the friction brake driver circuit and circuitry in proximity to the river circuit, such as resolver circuitry, which can also operate at frequencies around 10 kilohertz.

In accordance with certain embodiments described herein, electronic braking arrangement 100 includes current limiter circuit 104 and voltage limiter circuit 106. Current limiter circuit 104 and voltage limiter circuit 106 cooperate to limit voltage applied to brake stack assembly 108, thereby allowing voltage applied to source lead 110 and return lead 112 to vary within a predetermined voltage range. It is contemplated that the selected range can be between 220 and 450 volts, enabling electronic braking arrangement 100 to be retrofit into standardized electronic braking system.

Further, in certain embodiments electronic braking arrangement 100 is current-limited. In this respect current limiter circuit 104 and voltage limiter circuit 106 are arranged to limit current applied to each parallel electrical load arranged within brake stack assembly 108. The current limiting is such that current can rise through each of the electrical loads as resistance increases to a selected current magnitude that is within the current rating the electrical loads. The current thereafter remains constant notwithstanding further resistance increase in one or more of the electrical loads. For example, in a brake stack assembly with electrical loads rated for 0.6 amps, electronic braking arrangement 100 limits flow through each electrical load to about 0.4 amps or lower when one of the electrical load exhibits increased electrical resistance or becomes open, and thereafter causes current flow through each electrical load to remain at about 04 amps notwithstanding a second or more of the electrical loads to become open.

It is also contemplated that current limiter circuit 104 and voltage limiter circuit 106 be arranged to provide constant current in the event of resistance change, for example, current flow through each connected electrical load remaining constant notwithstanding resistance change from heating. For example, current flow can remain constant within a resistance range of between about 50 ohms and 120 ohms, thereby preventing overcurrent stress from heating associated with friction pad heating.

The methods and systems of the present disclosure, as described above and shown in the drawings, provide for electronic braking arrangements with superior properties including drive current without PWM, constant current, and/or variable voltage. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. An electronic braking arrangement, comprising:
   a brake stack assembly;
   a driver circuit operably connected to the brake stack assembly; and
   a current limiter circuit and a voltage limiter circuit connected in series with one another between the brake stack assembly and the driver circuit to drive friction brake loads in the brake stack assembly with a voltage limited constant drive current.

2. The electronic braking arrangement as recited in claim 1, wherein the brake stack assembly includes a plurality of electrical loads connected electrically in parallel with each other.

3. The electronic braking arrangement as recited in claim 1, wherein the brake stack assembly includes four electrical friction brake loads operably connected to four friction pads.

4. The electronic braking arrangement as recited in claim 1, wherein the driver circuit is arranged to issue a slowly ramping voltage pulse to the stack assembly through the driver circuit and current limiter circuit to actuate the brake stack assembly.

5. The electronic braking arrangement as recited in claim 1, wherein the driver circuit includes a source lead, a return lead, and a control lead.

6. The electronic braking arrangement as recited in claim 5, wherein the source lead is connected by the driver circuit to the current limiter circuit.

7. The electronic braking arrangement as recited in claim 5, wherein the return lead connects the voltage limiter circuit to a ground terminal through the driver circuit.

8. The electronic braking arrangement as recited in claim 5, wherein the driver circuit includes a solid-state switch connected in series between the source lead and the current limiter circuit, wherein the control lead is operably connected to the solid-state switch.

9. The electronic braking arrangement as recited in claim 1, wherein the current limiter circuit includes first and second resistor legs each having switch devices.

10. The electronic braking arrangement as recited in claim 9, wherein the first resistor leg includes an IGBT device with a collector and emitter, a reference voltage connected between the brake stack assembly and the IGBT emitter, and first and second resistors connected in series between the current limiter circuit and the IGBT collector.

11. The electronic braking arrangement as recited in claim 9, wherein the second resistor leg includes a MOSFET with a source and a drain, resistor connected in series with the MOSFET source, and a diode connected in series with the resistor, wherein the diode is arranged to oppose current flow from the brake stack assembly to the MOSFET.

12. The electronic braking arrangement as recited in claim 9, further comprising an IGBT device with an emitter and connected to the second resistor leg and a collector connected to the first resistor leg.

13. The electronic braking arrangement as recited in claim 1, wherein the voltage limiter circuit includes a MOSFET connect in series between the brake stack assembly and the current limiter circuit.

14. The electronic braking arrangement as recited in claim 13, wherein the MOSFET has a gate, a source, and drain, wherein the gate is connected to the return lead, wherein the source is connected to the brake stack assembly, and wherein the drain is connected to the current limiter circuit.

15. The electronic braking arrangement as recited in claim 14, further comprising serially connected Zener diodes and a capacitor, wherein the serially connected Zener diodes and capacitor are connected in parallel with one another between the source lead and the return lead.

16. An electronic parking brake arrangement for a landing gear system, comprising:
   a landing gear wheel assembly with a rotor;
   an electronic braking arrangement as recited in claim 1, wherein the brake stack assembly includes four electrical friction brake loads operably connected to four friction pads;
   wherein the four friction pads have a disengaged position and an engaged position, the friction pads being spaced apart from the rotor in the disengaged position, the friction pads being fixed against the rotor in the engaged position,
   wherein the driver circuit is arranged to issue a slowly ramping voltage pulse to the stack assembly through the driver circuit and current limiter circuit to actuate the brake stack assembly and move the friction pads between the disengaged and engaged positions.

* * * * *